(12) United States Patent
Mei et al.

(10) Patent No.: US 10,804,902 B1
(45) Date of Patent: Oct. 13, 2020

(54) LEVEL SHIFTER FOR INTEGRATED CIRCUIT

(71) Applicant: Silicon Storage Technology, Inc., San Jose, CA (US)

(72) Inventors: Ryan Mei, Shanghai (CN); Claire Zhu, Shanghai (CN); Xiaozhou Qian, Shanghai (CN)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/732,047

(22) Filed: Dec. 31, 2019

(51) Int. Cl.
*H03K 19/0185* (2006.01)
*H03K 3/356* (2006.01)

(52) U.S. Cl.
CPC ........... *H03K 19/018521* (2013.01); *H03K 3/356113* (2013.01)

(58) Field of Classification Search
None
See application file for complete search history.

(56) References Cited

U.S. PATENT DOCUMENTS

| | | |
|---|---|---|
| 6,043,699 A | 3/2000 | Shimizu |
| 6,650,168 B1 | 11/2003 | Wang |
| 7,205,820 B1 * | 4/2007 | Yeung ............. H03K 3/356165 326/81 |
| 7,808,294 B1 | 10/2010 | Kottapalli |
| 7,902,870 B1 | 3/2011 | Jiang |
| 8,102,199 B2 | 1/2012 | Chou |
| 8,115,514 B2 | 2/2012 | Deng |
| 8,400,206 B2 | 3/2013 | Benzer |
| 8,421,518 B2 | 4/2013 | Larsen |
| 8,593,204 B2 * | 11/2013 | Tobita ............ H03K 19/018521 326/62 |
| 8,669,803 B2 | 3/2014 | Huang et al. |
| 9,054,694 B2 | 6/2015 | Zhou |
| 9,780,790 B2 | 10/2017 | Potluri |
| 10,050,524 B1 | 8/2018 | Rana |
| 2003/0201800 A1 | 10/2003 | Matsuo |
| 2003/0234678 A1 | 12/2003 | Cleary |
| 2010/0214000 A1 | 8/2010 | Crespi et al. |
| 2010/0301900 A1 * | 12/2010 | Deng ............... H03K 3/356113 326/81 |
| 2011/0095804 A1 * | 4/2011 | Kumar ........... H03K 19/018521 327/333 |
| 2012/0112790 A1 | 5/2012 | Huang |
| 2013/0321027 A1 | 12/2013 | Zhou |

(Continued)

FOREIGN PATENT DOCUMENTS

IN 2015MUM517 2/2015

OTHER PUBLICATIONS

Moghe, et al., "Nanosecond Delay Floating High Voltage Level . . . Technology," pp. 485-497, IEEE Journal of Solid-State Circuits, vol. 46, No. 2, Feb. 2011.

(Continued)

*Primary Examiner* — Crystal L Hammond
(74) *Attorney, Agent, or Firm* — DLA Piper LLP US

(57) ABSTRACT

An improved level shifter for use in integrated circuits is disclosed. The level shifter is able to achieve a switching time below 1 ns while still using the core power supply voltages, VDDL and VDDH, used in the prior art. The improved level shifter comprises a coupling stage and a level-switching stage.

20 Claims, 8 Drawing Sheets

(56) References Cited

U.S. PATENT DOCUMENTS

2017/0331463 A1* 11/2017 Wang .................. G06F 1/26
2018/0287609 A1* 10/2018 Mallavajula ......... H03K 17/063
2019/0058475 A1*  2/2019 Chen .................. G11C 7/1057

OTHER PUBLICATIONS

Koo, et al., Mixed Signal Core P/T, Design Technology R&D Team Samsung Electronics, Korea, "A New Level-Up Shifter for High Speed and Wide Range . . . Sub-Micron," IEEE 2005, pp. 1063-1065.

Serneels, et al., Catholic University of Leuven Department ESAT-MICAS, "A High Speed, Low Voltage to High Voltage Level Shifter . . . CMOS," IEEE 2006, pp. 668-671.

* cited by examiner

Level Shifting Method
800

US 10,804,902 B1

LEVEL SHIFTER FOR INTEGRATED CIRCUIT

PRIORITY CLAIM

This application claims priority from Chinese Patent Application No. 201910733363.9, filed on Aug. 9, 2019, and titled, "Improved Level Shifter For Integrated Circuit."

FIELD OF THE INVENTION

An improved level shifter capable of operating at high speeds is disclosed.

BACKGROUND OF THE INVENTION

Level shifters are important components in integrated circuits. Level shifters convert digital signals from a first voltage domain into a second voltage domain, which is an essential function when different portions of an integrated circuit operate within different voltage domains.

FIG. 1 depicts prior art level shifter 100. In this example, in voltage domain 101, a "1" is represented by 1V and a "0" by 0V, and in voltage domain 102, a "1" is represented by 2.5V and a "0" by 0V. Level shifter 100 converts a "1" from voltage domain 101 (1V) into a "1" in voltage domain 102 (2.5V) and converts a "0" from voltage domain 101 (0V) into a "0" in voltage domain 102 (0V). Other voltage domains that utilize other voltages to represent a "1" and a "0" are known, and one of ordinary skill in the art will appreciate that the voltage values provided in FIG. 1 and herein are mere examples.

Embodiments of level shifter 100 will now be described with reference to FIGS. 2-4. First, FIG. 2 depicts inverters 201 and 202, where inverter 201 receives INPUT as a signal and produces A as an output (which is the complement of INPUT), and inverter 202 receives A as in input and produces A-BAR as an output (which is the complement of A and is logically the same as INPUT). Here, a "1" value will have voltage VDDL, which can be, for example, 1V. VDDL may be a low voltage core power supply voltage.

FIG. 3 depicts prior art level shifter 300, which is an example of level shifter 100. Level shifter 300 comprises NMOS transistors 301 and 302, PMOS transistors 303 and 304, and inverter 305. Signal A from FIG. 2 is provided to the gate of NMOS transistor 301, and signal A-BAR from FIG. 2 is provided to the gate of NMOS transistor 302.

When A is high, NMOS transistor 301 will be on and transistor 302 will be off. The input to inverter 305 will be pulled to ground through NMOS transistor 301, which also will turn on the gate to PMOS transistor 304. The output of inverter 305, labeled OUTPUT, will be high, which here will be a voltage VDDH, which can be, for example, 2.5V. VDDH may be a high voltage core power supply voltage.

When A is low, NMOS transistor 301 will be off and NMOS transistor 302 will be on. PMOS transistor 303 will be on, since its gate will be pulled to ground through NMOS transistor 302, which will cause the input to inverter 305 to be pulled high through PMOS transistor 303. OUTPUT will then be low.

Prior art level shifter 300 has a significant limitation. Specifically, level shifter 300 cannot operate at switching times less than around 0.5 ns. In the worst case, the switching time can be as high as 1 ns or more. This is due to the inherent variability in the current driving capability of each transistor. In addition, level shifter 300 can fail altogether if the peak voltage of A and A-BAR are too low due to low supply voltage VDDL in FIG. 2 being too low.

FIG. 4 depicts prior art level shifter 400, which is another example of level shifter 100, and which has a shorter switching time than level shifter 300. Level shifter 400 comprises NMOS transistors 401 and 402; PMOS transistors 403, 404, 405, and 406; and inverter 407. Signal A from FIG. 2 is provided to the gate of NMOS transistor 401 and the gate of PMOS transistor 405, and signal A-BAR from FIG. 2 is provided to the gate of NMOS transistor 402 and the gate of PMOS transistor 406.

When A is high, NMOS transistor 401 will be on, transistor 402 will be off, PMOS transistor 405 will be off, and PMOS transistor 406 will be on. The input to inverter 407 will be pulled to ground through NMOS transistor 401, which also will pull down the gate of PMOS transistor 404, thereby turning on PMOS transistor 404, which in turn will cause the gate of PMOS transistor 403 to be pulled high to VDDH through PMOS transistors 404 and 406. The output of inverter 407, labeled OUTPUT, will be high, which here will be a voltage VDDH, which can be, for example, 2.5V.

When A is low, NMOS transistor 401 will be off, NMOS transistor 402 will be on, PMOS transistor 405 will be on, and PMOS transistor 406 will be off. PMOS transistor 403 will be on, since its gate will be pulled to ground through NMOS transistor 402, which will cause the input to inverter 407 to be pulled high to VDDH through PMOS transistors 403 and 405. OUTPUT will then be low.

Although level shifter 400 has a faster switching time than level shifter 300, level shifter 400 is still limited. Specifically, it is unable to decrease the switching time below 1 ns. In addition, level shifter 400 can fail altogether if the peak voltage of A and A-BAR are too low due to low supply voltage VDDL in FIG. 2 being too low.

What is needed is an improved level shifting design that is able to decrease its switching time below 1 ns while still using the same core power supply voltages, VDDL and VDDH, used in the prior art.

SUMMARY OF THE INVENTION

An improved level shifter is disclosed. The level shifter is able to achieve a switching time below 1 ns while still using the core power supply voltages, VDDL and VDDH, used in the prior art. The improved level shifter comprises a coupling stage and a level-switching stage.

DETAILED DESCRIPTION OF THE INVENTION

Figure 5:
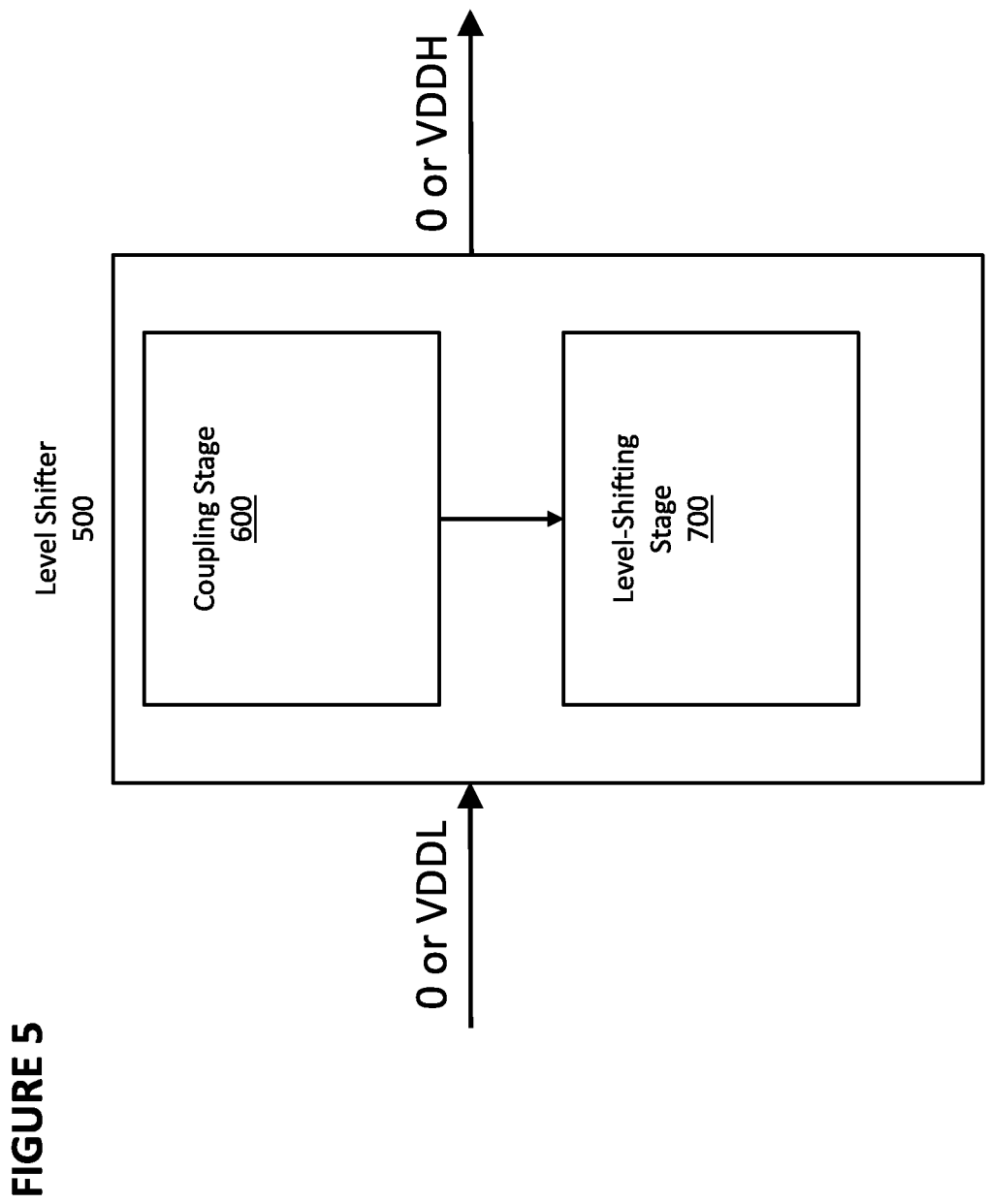
FIG. 5 depicts a level shifter.

FIG. 5 depicts level shifter 500, which comprises coupling stage 600 and level-shifting stage 700. When level shifter 500 receives a "0" as an input, where "0" is a first voltage, it outputs a "0", i.e. the first voltage, and when it receives a "1" of a first voltage domain (VDDL), which is a second voltage, as an input, and it outputs a "1" of a second voltage domain (VDDH), which is a third voltage different from the first or second voltages.

Figure 1:
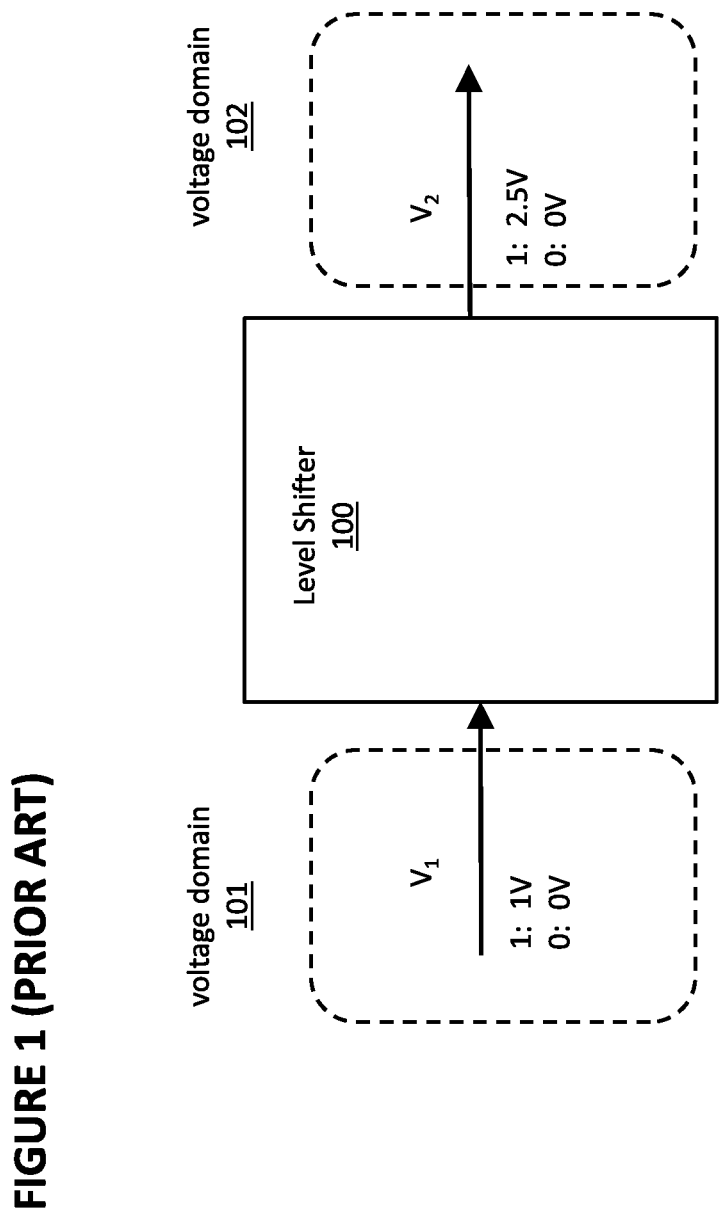
FIG. 1 depicts a prior art level shifter.
Figure 2:
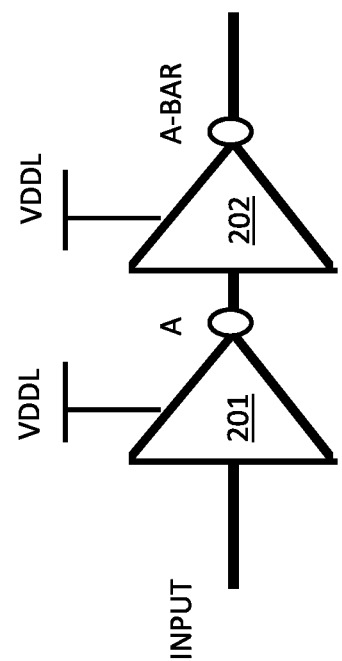
FIG. 2 depicts a prior art set of inverters.
Figure 3:
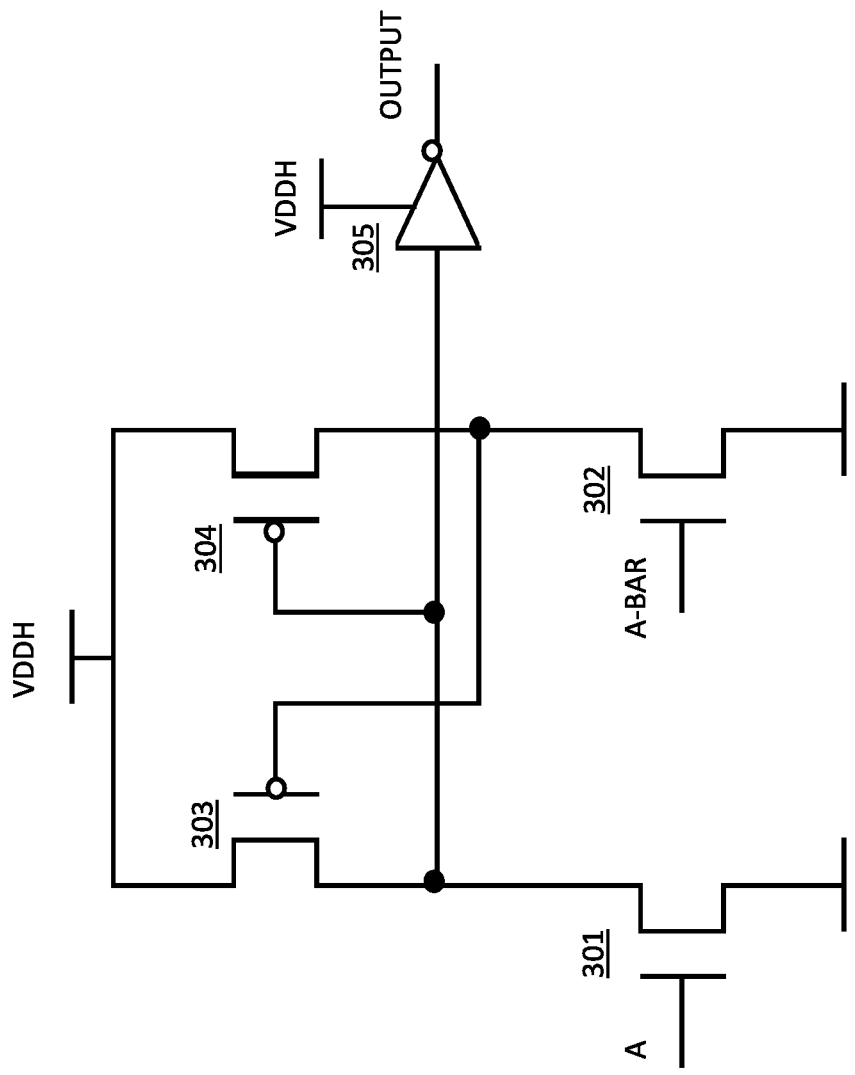
FIG. 3 depicts a prior art level shifter.
Figure 4:
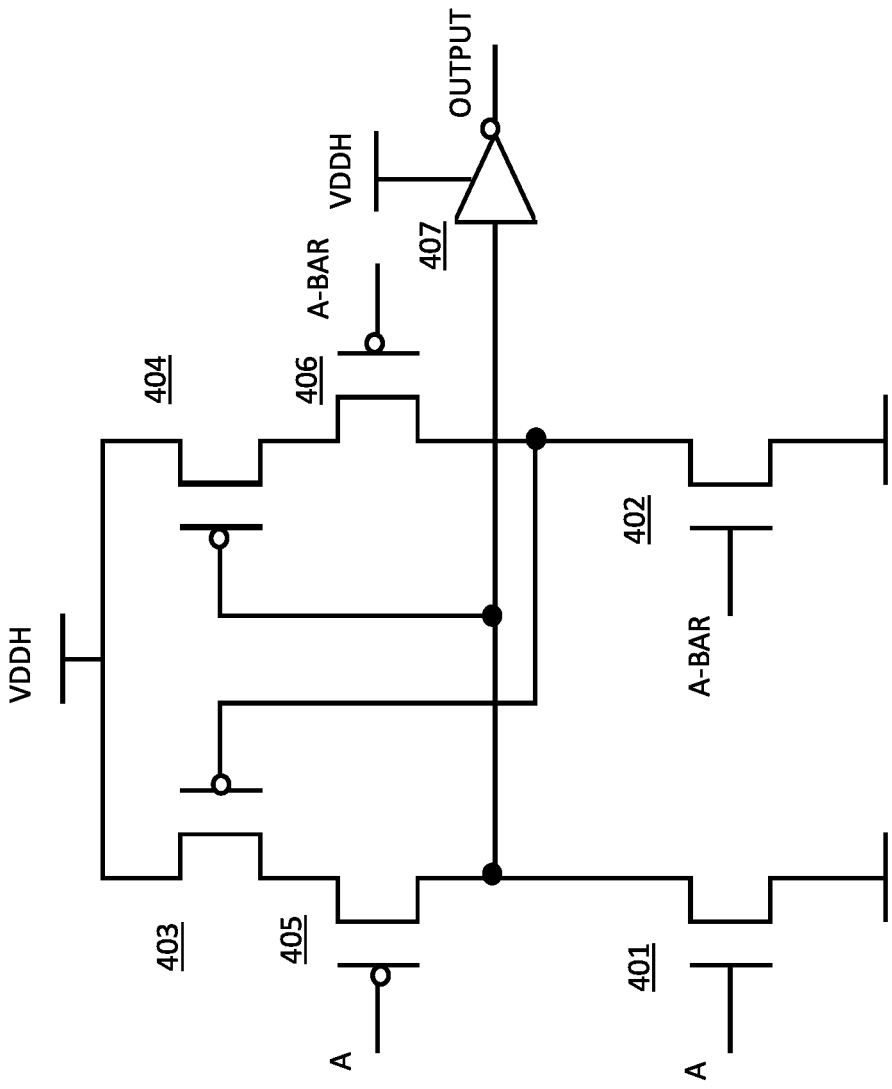
FIG. 4 depicts another prior art level shifter.
Figure 6:
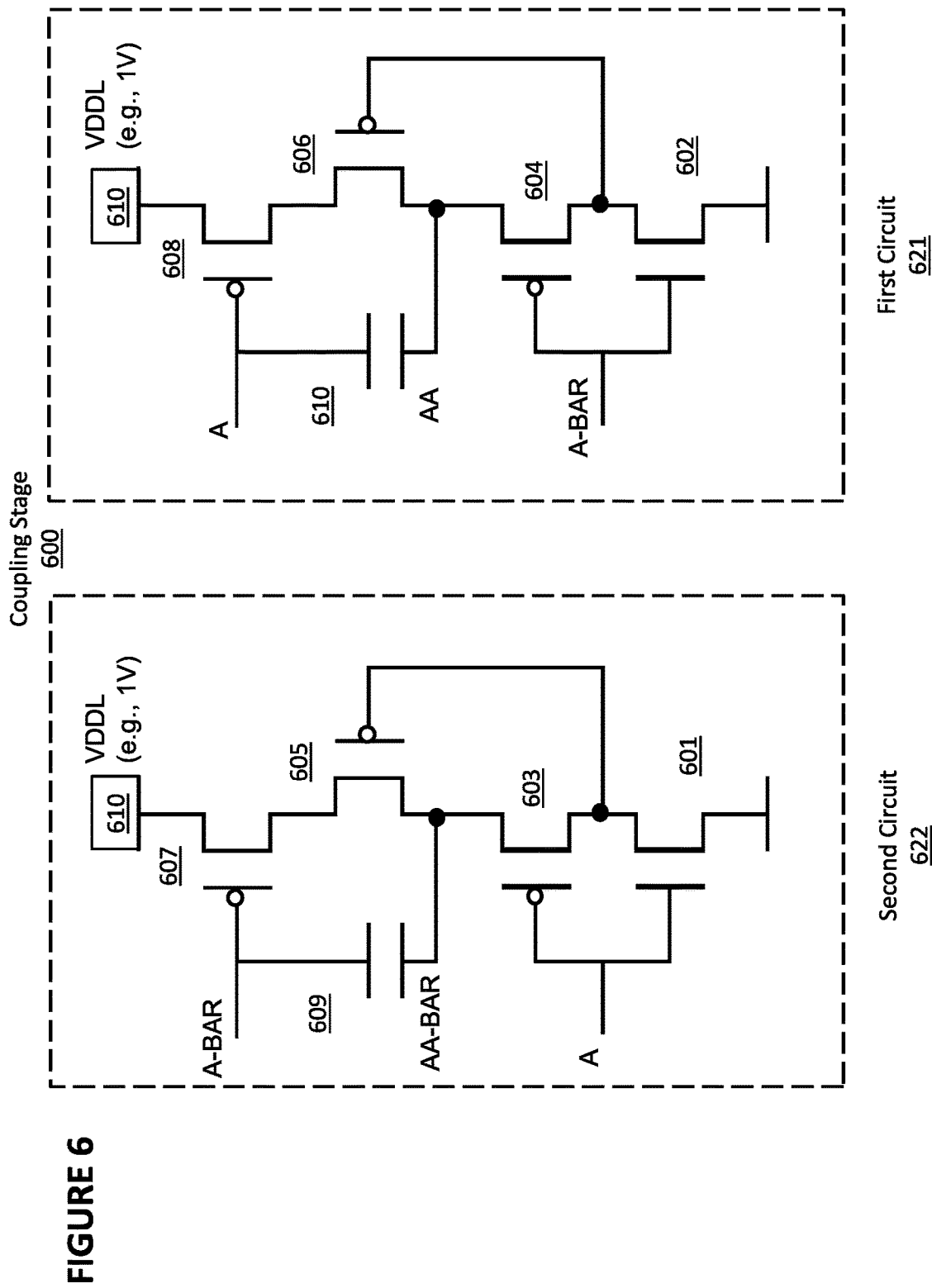
FIG. 6 depicts a coupling stage of the level shifter of FIG. 5.

FIG. 6 depicts coupling stage 600, which comprises first circuit 621 and second circuit 622, both powered by low voltage power source 610, which outputs voltage VDDL. First circuit 621 comprises NMOS transistor 602; PMOS transistors 604, 606, and 608; and capacitor 610. Second circuit 622 comprises NMOS transistor 601; PMOS transistors 603, 605, and 607; and capacitor 609. Signal A from FIG. 2 is provided to the gates of NMOS transistor 601 and PMOS transistor 603, and signal A-BAR from FIG. 2 is provided to the gates of NMOS transistor 602 and PMOS transistor 604.

The operation of first circuit 621 will now be described. When A is high, A-BAR is low and NMOS transistor 602 is off, PMOS transistor 604 is on, and PMOS transistor 608 is off. The voltage AA will be floating since both NMOS transistor 602 is off and PMOS transistor 608 is off and will be around 0V in the initial state after start-up, since any vestigial charge on capacitor 610 would have dissipated in the absence of any power source.

When A switches from high to low, A-BAR will switch from low to high, NMOS transistor 602 will turn on, PMOS transistor 604 will turn off, and PMOS transistor 608 will turn on since the signal A is provided to the gate of PMOS transistor 608. PMOS transistor 606 also will turn on since its gate will be pulled to ground through NMOS transistor 602. Capacitor 610 will begin charging and the node labeled AA will approach the voltage VDDL since PMOS transistor 606 will be on and is coupled to the power source providing VDDL through PMOS transistor 608. The above has been described as having a source of NMOS transistor 602 being connected to ground, however this is not meant to be limiting in any way, and any return voltage in relation to VDDH may be utilized in place of ground, throughout this document, without exceeding the scope. The first voltage, i.e. a "0" in the second voltage domain, is a voltage approaching the return voltage.

When A then switches from low to high, A-BAR will switch from high to low. NMOS transistor 602 will be turned off, PMOS transistor 604 will be turned on, and PMOS transistor 608 will be turned off since A is provided to the gate of PMOS transistor 608. The gate of PMOS transistor 606 will be at the voltage AA (which will start at VDDL) and will be off. Because A is driving the top plate of capacitor 610 from low to high (which is VDDL), AA will be driven to 2*VDDL by capacitor 610.

When A then switches from high to low, PMOS transistor 608 will turn on, NMOS transistor 602 will turn on, pulling the gate of PMOS transistor 606 to ground and turning on PMOS transistor 606, which will pull node AA to voltage VDDL.

The operation of second circuit 622 will now be described. When A is low, A-BAR will be high, NMOS transistor 601 is off, PMOS transistor 603 is on, and PMOS transistor 607 is off since A-BAR is provided to its gate. The voltage AA-BAR will be floating since both NMOS transistor 601 and PMOS transistor 607 are off and will be around 0V in the initial state after start-up, since any vestigial charge on capacitor 610 would have dissipated in the absence of any power source.

When A switches from low to high, A-BAR will switch from high to low, NMOS transistor 601 will turn on, PMOS transistor 603 will turn off, and PMOS transistor 607 will turn on since A-BAR is provided to its gate. PMOS transistor 605 also will turn on since its gate will be pulled to ground through NMOS transistor 601. The bottom plate of capacitor 609 will be pulled to VDDL through PMOS transistors 607 and 605, and the node labeled AA-BAR will obtain a voltage VDDL.

When A then switches from high to low, A-BAR will switch from low to high, NMOS transistor 601 will be turned off, PMOS transistor 603 will be turned on, and PMOS transistor 607 will be turned off since A-BAR is provided to its gate. The gate of PMOS transistor 605 will be at the voltage AA-BAR (which will start at VDDL) through PMOS transistor 603 and will therefore be off. Because A-BAR is driving the top plate of capacitor 609 from low to high (which is VDDL), AA-BAR will be driven to 2*VDDL by capacitor 609

When A then switches from low to high, A-BAR will switch from high to low, PMOS transistor 607 will turn on and NMOS transistor 601 will turn on, pulling the gate of PMOS transistor 605 to ground and turning on PMOS transistor 605, which will pull node AA-BAR to voltage VDDL through PMOS transistors 605 and 607.

Thus, node AA will oscillate between VDDL and 2*VDDL, and node AA-BAR will oscillate between 2*VDDL and VDDL.

Figure 7:
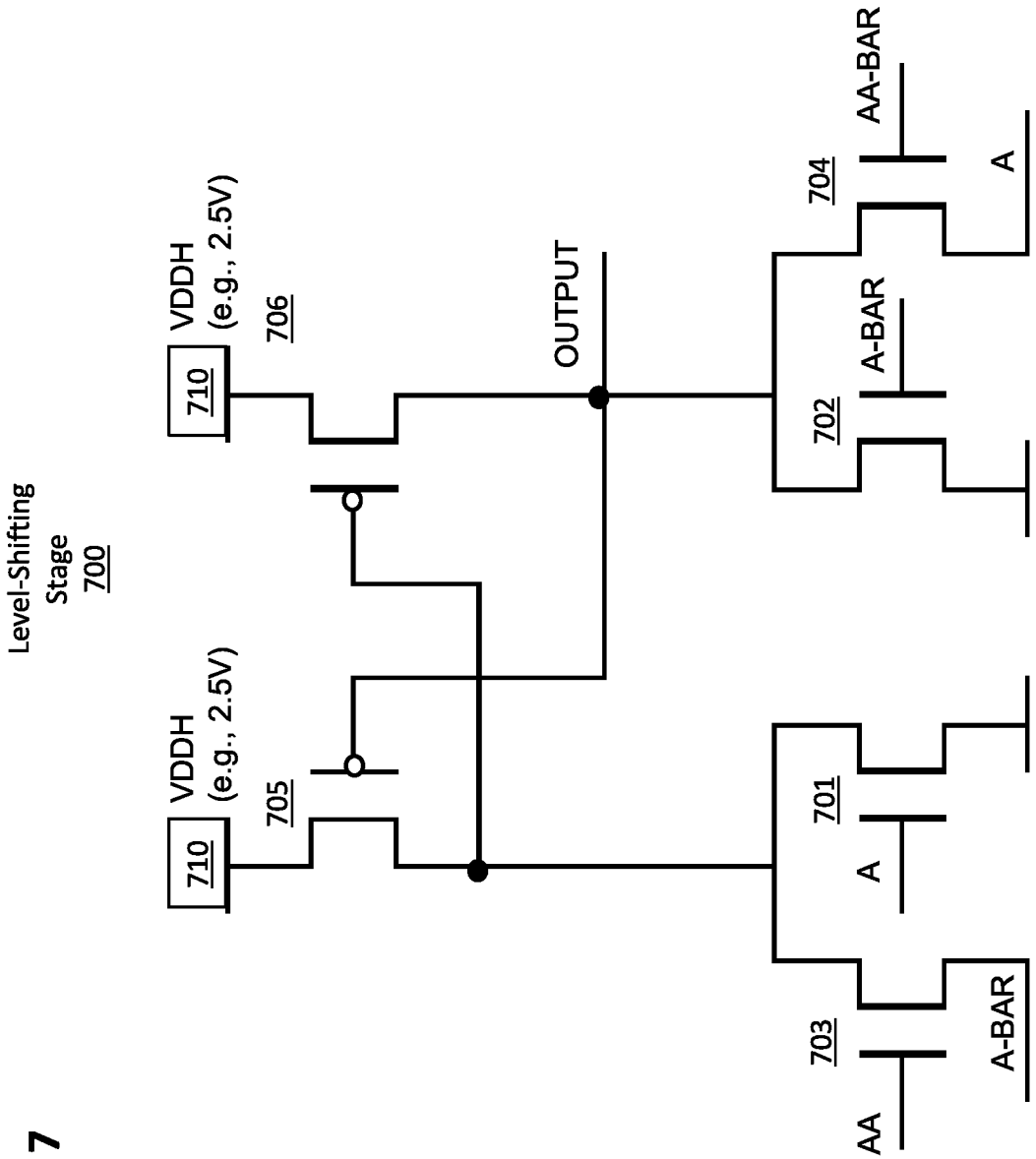
FIG. 7 depicts a level shifting circuit of the level shifter of FIG. 5.

FIG. 7 depicts level-shifting stage 700, which comprises NMOS transistors 701, 702, 703, and 704, PMOS transistors 705 and 706, and high power source 710, which outputs voltage VDDH. Signal A from FIG. 2 is provided to the gate of NMOS transistor 701 and one terminal of NMOS transistor 704. Signal A-BAR from FIG. 2 is provided to the gate of NMOS transistor 702 and one terminal of NMOS transistor 703. Node AA from FIG. 5 is provided to the gate of NMOS transistor 703, and node AA-BAR from FIG. 5 is provided to the gate of NMOS transistor 704. Again, node AA will oscillate between VDDL and 2*VDDL, and node AA-BAR will oscillate between 2*VDDL and VDDL.

When A switches from 1 (VDDL) to 0, A-BAR will switch from 0 to 1 (VDDL), AA will be VDDL, and AA-BAR will be 2*VDDL. NMOS transistor 701 will be off, NMOS transistor 702 will be on, NMOS transistor 703 will be off (since AA and A-BAR will both be VDDL), and NMOS transistor 704 will be on. This will pull node OUTPUT to ground through transistors 702 and 704.

When A switches from 0 to 1 (VDDL), A-BAR will switch from 1 to 0, AA will be 2*VDDL, and AA-BAR will be VDDL. NMOS transistor 701 will be on, NMOS transistor 702 will be off, NMOS transistor 703 will be on, and NMOS transistor 704 will be off (since A and AA-BAR will both be VDDL), and NMOS transistor 704 will be off. The gate of PMOS transistor 706 will be pulled to ground through NMOS transistors 701 and 703, which will turn on PMOS transistor 706 and cause OUPUT to be pulled to VDDH.

Notably, when A switches from 1 to 0, NMOS transistors 702 and 704 are able to pull the node OUTPUT to ground faster than level shifters 300 and 400 because NMOS transistor 704's overdriving voltage is two times higher. Specifically, the Vgs of pull-down NMOS transistor 704 is 2*VDDL while the Vgs of NMOS transistor 302 and the Vgs of NMOS transistor 402 in level shifter 400 is only VDDL. As a result, OUTPUT in level shifter 700 can be pulled to '0' faster than in level shifter 400.

Similarly, when A switches from 0 to 1, NMOS transistors 701 and 703 are able to pull the gate of PMOS transistor 706 to ground faster than level shifters 300 and 400 because NMOS transistor 703's overdriving voltage is two times higher. As a result, OUTPUT is pulled to VDDH in a very short time. Specifically, the Vgs of pull-down NMOS transistor 703 is 2*VDDL while the Vgs of NMOS transistor 301 in level shifter 300 and the Vgs of NMOS transistor 401 in level shifter 400 each is only VDDL. As a result, the gate of PMOS transistor 706 will be pulled down to '0' quickly and OUTPUT will be pulled up to VDDH faster than in level shifters 300 and 400.

That is, level shifter 500 is able to switch faster than level shifters 300 and 400, meaning that the required switching time for level shifter 500 is smaller than the required switching times for level shifters 300 and 400.

Applicant has performed experiments to compare the shifting speed of level shifter 500 against prior art level shifters 300 and 400. For the conditions VDDL=0.94 to 1.26 V, VDDH=1.4 to 2.75 V, and temperature=−40 degrees C. to 160 degrees C., level shifter 500 was 3.5× faster when A switches from 0 to 1, and 5.7× faster when A switches from 1 to 0. Thus, level shifter 500 is at least 3.5× faster in its switching time than level shifters 300 and 400.

Figure 8:
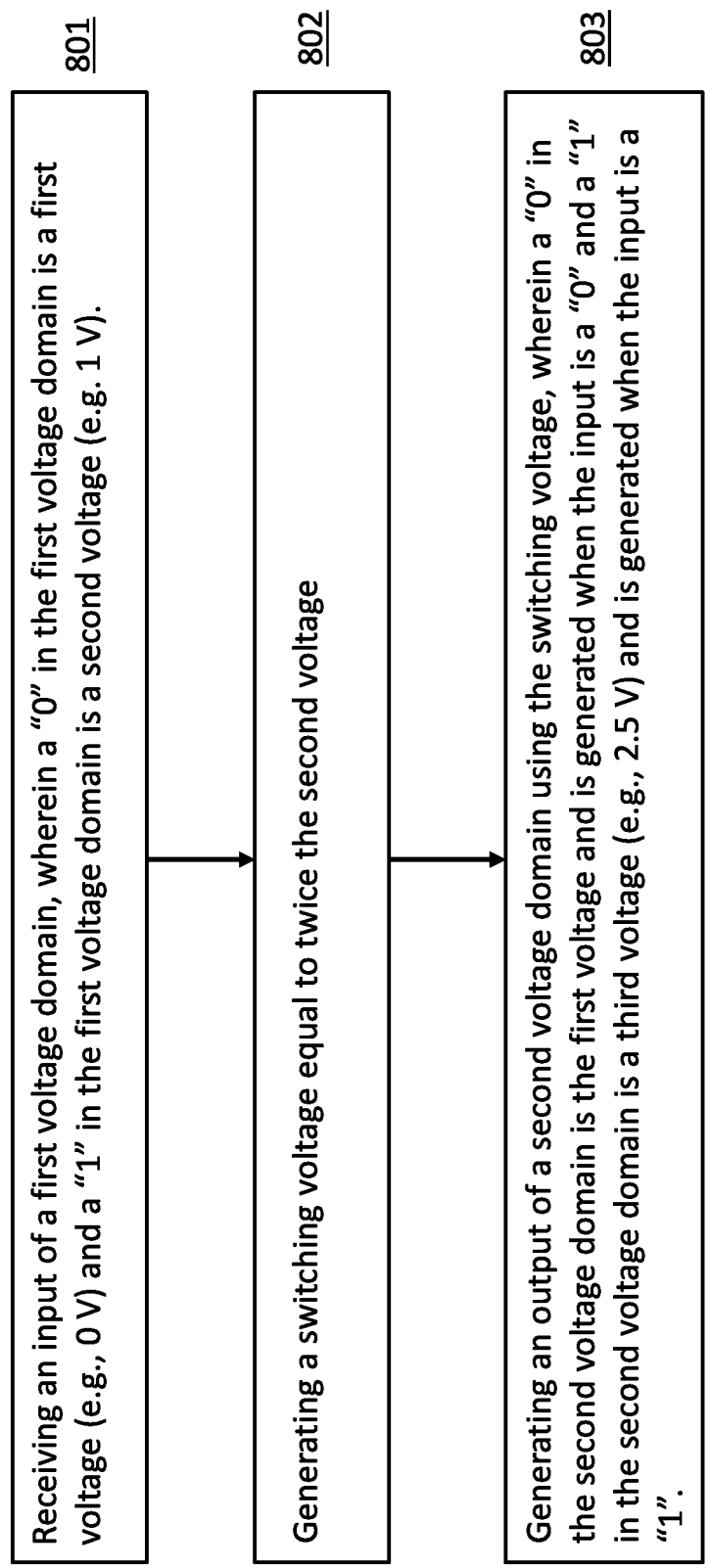
FIG. 8 depicts a level-shifting method.

FIG. 8 depicts level shifting method 800, which can be implemented using level shifter 500. The first step is receiving an input of a first voltage domain, wherein a "0" in the first voltage domain is a first voltage (e.g., 0 V) and a "1" in the first voltage domain is a second voltage (e.g. 1 V) (step 801). The second step is generating a switching voltage equal to twice the second voltage (step 802). The third step is generating an output of a second voltage domain using the switching voltage, wherein a "0" in the second voltage domain is the first voltage and is generated when the input is a "0" and a "1" in the second voltage domain is a third voltage (e.g., 2.5 V) and is generated when the input is a "1" (step 803).

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A level shifter for receiving an input of a first voltage domain and generating an output of a second voltage domain, wherein a "0" in the first voltage domain is a first voltage and a "1" in the first voltage domain is a second voltage and a "0" in the second voltage domain is the first voltage and a "1" in the second voltage domain is a third voltage different than the second voltage, the level shifter comprising:
   a first power source providing the third voltage;
   a first PMOS transistor comprising a first terminal coupled to the first power source, a gate, and a second terminal;
   a second PMOS transistor comprising a first terminal coupled to the first power source, a gate coupled to the second terminal of the first PMOS circuit, and a second terminal coupled to the gate of the first PMOS transistor and to an output node for providing the output;
   a first NMOS transistor comprising a first terminal coupled to the second terminal of the first PMOS circuit, a gate configured to receive a first signal; and a second terminal configured to receive a complement of the input;
   a second NMOS transistor comprising a first terminal coupled to the second terminal of the first PMOS circuit, a gate configured to receive the input, and a second terminal coupled to the first voltage;
   a third NMOS circuit comprising a first terminal coupled to the output node, a gate configured to receive the complement of the input, and a second terminal coupled to the first voltage; and
   a fourth NMOS circuit comprising a first terminal coupled to the output node, a gate coupled to receive a second signal, and a second terminal configured to receive the input;
   wherein the first signal is floating or is twice the second voltage when the input is at the second voltage and is the second voltage when the input is at the first voltage; and
   wherein the second signal is floating or is twice the second voltage when the input is at the first voltage and is the second voltage when the input is at the second voltage.

2. The level shifter of claim 1, further comprising a second power source providing the second voltage.

3. The level shifter of claim 2, wherein the first signal is generated by a first circuit comprising:
   a third PMOS transistor comprising a first terminal coupled to the second power source, a gate, and a second terminal;
   a fourth PMOS transistor comprising a first terminal coupled to the second terminal of the third PMOS transistor, a gate, and a second terminal;
   a fifth PMOS transistor comprising a first terminal coupled to the second terminal of the fourth PMOS transistor, a gate configured to receive the complement of the input, and a second terminal coupled to the gate of the fourth PMOS transistor;
   a fifth NMOS transistor comprising a first terminal coupled to the second terminal of the fifth PMOS transistor, a gate configured to receive the complement of the input; and a second terminal coupled to the first voltage; and
   a first capacitor comprising a first terminal coupled to the gate of the third PMOS transistor and a second terminal coupled to the second terminal of the fourth PMOS transistor.

4. The level shifter of claim 3, wherein the second signal is generated by a second circuit comprising:
- a sixth PMOS transistor comprising a first terminal coupled to the second power source, a gate, and a second terminal;
- a seventh PMOS transistor comprising a first terminal coupled to the second terminal of the sixth PMOS transistor, a gate, and a second terminal;
- an eighth PMOS transistor comprising a first terminal coupled to the second terminal of the seventh PMOS transistor, a gate configured to receive the input, and a second terminal coupled to the gate of the seventh PMOS transistor;
- a sixth NMOS transistor comprising a first terminal coupled to the second terminal of the eighth PMOS transistor, a gate configured to receive the input, and a second terminal coupled to the first voltage; and
- a capacitor comprising a first terminal coupled to the gate of the sixth PMOS transistor and a second terminal coupled to the second terminal of the seventh PMOS transistor.

5. The level shifter of claim 4, wherein the first voltage is ground.

6. The level shifter of claim 5, wherein the second voltage is 1V.

7. The level shifter of claim 6, wherein the third voltage is 2.5V.

8. The level shifter of claim 3, wherein the first voltage is ground.

9. The level shifter of claim 8, wherein the second voltage is 1V.

10. The level shifter of claim 9, wherein the third voltage is 2.5V.

11. The level shifter of claim 2, wherein the first voltage is ground.

12. The level shifter of claim 11, wherein the second voltage is 1V.

13. The level shifter of claim 12, wherein the third voltage is 2.5V.

14. The level shifter of claim 1, wherein the first voltage is ground.

15. The level shifter of claim 14, wherein the second voltage is 1V.

16. The level shifter of claim 15, wherein the third voltage is 2.5V.

17. A method of shifting from a first voltage domain to a second voltage domain, the method comprising:
- receiving an input of a first voltage domain, wherein a "0" in the first voltage domain is a first voltage and a "1" in the first voltage domain is a second voltage;
- generating a switching voltage equal to twice the second voltage;
- generating an output of a second voltage domain using the switching voltage, wherein a "0" in the second voltage domain is the first voltage and is generated when the input is a "0" and a "1" in the second voltage domain is a third voltage and is generated when the input is a "1".

18. The method of claim 17, wherein the first voltage is ground.

19. The method of claim 18, wherein the second voltage is 1V.

20. The method of claim 19, wherein the third voltage is 2.5V.

* * * * *